(12) United States Patent
Uemura (10) Patent No.: US 6,310,364 B1
(45) Date of Patent: Oct. 30, 2001

(54) LIGHT-EMITTING APPARATUS (75) Inventor: Toshiya Uemura, Tsushima (JP)

(73) Assignee: Toyoda Gosei Co., Ltd., Nishikasugai-gun (JP)

( * ) Notice: Subject to any disclaimer, the term of this patent is extended or adjusted under 35 U.S.C. 154(b) by 0 days.

(21) Appl. No.: 09/365,832

(22) Filed: Aug. 3, 1999

(30) Foreign Application Priority Data

Aug. 3, 1998 (JP) .................................................. 10-219246

(51) Int. Cl.⁷ .................................................... H01L 33/00
(52) U.S. Cl. ............................ 257/100; 257/98; 257/103; 257/82; 257/81; 257/99; 257/706
(58) Field of Search ................ 257/100, 98, 103, 257/82, 706, 707, 717, 99, 81; 437/22; 313/505, 512; 340/825

(56) References Cited

U.S. PATENT DOCUMENTS

| | | | |
|---|---|---|---|
| 3,676,668 | * 7/1972 | Collins et al. | 240/103 R |
| 4,081,764 | * 3/1978 | Christmann et al. | 331/94.5 |
| 4,122,479 | * 10/1978 | Sugawara et al. | 357/19 |
| 5,394,298 | * 2/1995 | Sagisaka | 361/704 |
| 5,513,021 | * 4/1996 | Kaneshiro et al. | 359/15 |
| 5,530,269 | * 6/1996 | Tang | 257/88 |
| 5,563,422 | * 10/1996 | Nakamura et al. | 257/13 |
| 5,813,753 | * 9/1998 | Vriens et al. | 362/293 |
| 5,886,401 | * 3/1999 | Liu | 257/678 |
| 5,959,316 | * 9/1999 | Lowery | 257/98 |
| 5,998,232 | * 12/1999 | Maruska | 438/46 |
| 6,011,312 | * 1/2000 | Nakazawa et al. | 257/778 |
| 6,093,939 | * 7/2000 | Artigue et al. | 257/99 |

FOREIGN PATENT DOCUMENTS

| | | | |
|---|---|---|---|
| 356079482 | * 6/1981 | (JP) | 257/91 |
| 358043584 | * 3/1983 | (JP) | 257/100 |
| 406232458 | * 8/1994 | (JP) | 257/100 |
| 7-235558 | 9/1995 | (JP) . | |
| 408007614 | * 1/1996 | (JP) . | |
| 411046015 | * 2/1999 | (JP) . | |

* cited by examiner

*Primary Examiner*—Eddie Lee
*Assistant Examiner*—Eugene Lee
(74) *Attorney, Agent, or Firm*—Pillsbury Winthrop LLP (57) ABSTRACT

A transparent base having a GaN semiconductor light-emitting device fixed thereon with a transparent adhesive is fitted to lead frames by flip chip bonding in such a manner that the light from the device is emitted outside through the substrate of the device, the adhesive, the base, and a sealing resin in this order. The apparatus has high relaibility beacause the sealing resin in the dominant direction or light emission is protected against color change due to the heat generated from the device.

13 Claims, 5 Drawing Sheets

LIGHT-EMITTING APPARATUS

BACKGROUND OF INVENTION

Field of invention

This invention relates to a light-emitting apparatus having a GaN semiconductor light-emitting device. More particularly, the present invention relates to an improvement on a light-emitting apparatus having a semiconductor light-emitting device integrated by flip chip bonding.

GaN semiconductors have been attracting attention as a material for light-emitting device emitting blue to green light. A light-emitting diode comprising such a GaN semiconductor is incorporated into a light-emitting apparatus as follows. Since a general light-emitting diode uses an insulating sapphire substrate, a pair of electrodes (i.e., a negative electrode and a positive electrode) are provided on the upper side of the semiconductor layer.

A first lead frame has a mount, onto which a substrate or a light-emitting diode is adhered with the semiconductor layer up so that the semicoductor layer faces the dominant light emitting direction of the light-emitting apparatus. The negative electrode and the postive electrode of the light-emitting diode are connected to the first and second lead frames, respectively. These members are encapsulated in a transparent sealing resin, such as an epoxy resin.

In the above-described light-emitting apparatus, blue to green light generated in the light-emitting layer in the semiconductor layer is transmitted through the semiconductor layer and emitted outside or reflected on the mount of the first lead frame, transmitted through the semiconductor layer again, and emitted outside. Accordingly, the direction perpendicular to the semiconductor layer is the dominant light-emitting direction. For more details, JP-A-7-23558 can be referred to.

However, conventional sealing resin, such as an epoxy resin, is liable to color change, and the color change is accelerated by beat. According to the inventor's study, a sealing resin is observed to undergo gradual color change to yellow to browm around a semiconductor layer that is accompanied by heat generation while emitting light. The resin thus yellowed or browned absorbs blue to green light emitted from the light-emitting diode. That is, the brightness of a light-emitting apparatus (the quantity of light emitted outside through the sealing resin) is reduced with the progress of color change of the sealing resin.

In order to solve this problem, flip chip bonding has been proposed, in which a light-emitting diode is reversed, and the negative and the positive elcetrodes are mounted directly on the lead frames by soldering, etc. For more detail, JP-A-56-79482 can be referred to. According to this structure, the heat generated from the light-emitting device is easily dissipated outside through the lead frames so that the color change of the sealing resin can be suppressed.

The distance between the negative and the positive electrodes is governed by the size of the light-emitting device, which is as small as about 350 $\mu$m. On the other hand, since a lead frame is formed by metal sheet working, the working precision is limited to the metal sheet thickness (e.g., 0.5 mn). Therefore, it is difficult to work a metal sheet in conformity to the distance between the electrodes of a light-emitting device. Assuming precise metal sheet working is possible, it is extremely difficult and impractical to fix the electrodes on the mounts of lead frames with positioning accuracy on the order of microns.

A light-emitting apparatus using a sealing resin having dispersed therein a fluoresent material to have the color of emitted light changed is known. For example, part of blue light generated from a light-emitting device is absorbed by the fluorescent material so that orange light is emitted from the fluorescent material. The blue light that does not pass through the fluorescent material and the orange light emitted from the fluorescent material are mixed up so that the Light-emitting device emits white light as a whole. However, it has been difficult with conventional Light-emitting apparatus of this type to secure color unchangeability of the emitted light for a long period of time because the sealing resin undergoes color change with time due to the heat generated in the Light-emitting device.

SUMMARY OF INVENTION

Accordingly, an object of the present invention is to settle the above-mentioned problem by providing on an industrial scale a light-emitting apparatus having a GaN semiconductor Light-emitting device incorporated therein in the form of a flip chip.

Another object of the invention is to provide a light-emitting apparatus having a novel structure.

Another object of the present invention will then be illustrated. This aspcet aims to provide a highly reliable Light-emitting apparatus with a new function. This Light-emitting apparatus according to this aspect is characterized in that the base contains a fluorescent material, with the construction of the other elements being the same as described later.

The above objects of the invention are accomplished by a light-emitting apparatus comprising (1) a transparent base made of an inorganic material, (2) a first and a second bonding pad formed on the base, (3) a GaN semiconductor Light-emitting device having a first and a second electrode on one side thereof, (4) a first wire and a second wire which connect the first bonding pad to the first electrode and the second bonding pad to the second electrode, respectively, (5) a first and a second lead frame, (6) a transparent adhesive layer which fixes the transparent substrate of the semiconductor Light-emitting device to a first surface of the base, and (7) a transparent resin which encapsulates the base, the Light-emitting device, the first and the second wires, the first and the second lead frames, and the adhesive layer, wherein the base is fixed to the first and second lead frames so that the substrate of the semiconductor Light-emitting device may face the dominant light-emitting direction or the Light-emitting apparatus, and the first and second bonding pads are electrically connected to the first and second lead frames, respectively.

According to this structure, the substrate (of the semiconductor Light-emitting device), the adhesive layer, the base, and the sealing resin are lying in this order on the light-emitting layer of the semiconductor Light-emitting device in the dominant light-emitting direction. Made of an inorganic material, the substrate and the base undergo little change in color. Most of the heat generated in the semiconductor layer during light emission is conducted to the other members and dissipated there before it reaches the sealing resin on the base. As a result, the sealing resin on the base is prevented from yellowing or browning by heat.

Only the adhesive layer undergoes color change under the influence of the heat of the semiconductor layer, but the influence of the heat upon the adhesive layer is lessened by the substrate interposed between the adhesive layer and the semiconductor layer. Therefore, the degree of the adhesive layer's color change is less than what would have been observed with the sealing resin directly covering the semiconductor layer in a conventional structure. Besides, because an adhesive layer can be made thin, the quantity of light that may be absorbed by a somewhat colored adhesive layer can be minimized.

The sealing resin covering the semiconductor layer naturally undergoes color change, but the influence of the color change is negligible because the colored portion is on the side opposite to the dominant LE side. Where the electrodes of the semiconductor Light-emitting device are formed of a light-emitting metal and cover the entire surface of the semiconductor layer, the light emitted from the LE layer in the direction opposite to the dominant light-emitting direction is reflected on these electrodes. Therefore, the colored resin portion is substantially out of the light transmission path.

According to the present invention, the semiconductor Light-emitting device is fixed on the base, and the base is attached to the first and second lead frames. Therefore, the demand for the working precision of the first and second lead frames can be relaxed by the design of the base and it is easier to attach the base to the first and second lead frames. It has now been made feasible to attach the semiconductor device to the lead frames via the base in the form of a flip chip. For example, the first and second bonding pads are provided on each side of the semiconductor Light-emitting device, whereby the distance between the bonding pads is longer than at least the external size of the semiconductor Light-emitting device. The first and second bonding pads are adhered to the first and second lead frames, respectively, whereby the working precision required of the lead frames is above the external size of the semiconductor Light-emiting device. Taking the margin between the semiconductor Light-emitting device and each bonding pad into consideration, the demanded working precision is much lower than that called for in conventional flip chip bonding, i.e., a precision corresponding to the distance between electrodes.

The longer the distance between the parts of the two bonding pads where they are bonded to the respective lead frames, the less the demand for the working precision of the lead frames, and the easier the attachment to the lead frames. It is therefore desirable that the parts of the first and second bonding pads which are the most remote from each other (i.e., the outer edges of the bonding pads) be even with the outer edges of the base. Where the base is rectangular in its plane view, the first and second bonding pads are preferably disposed substantially in parallel with the long side of the rectangular base or on the diagonal line of the rectangular base so that the outer edges of the first and second bonding pads may be remotest from each other.

According to the present invention, a fluorescent material is not dispersed in the sealing resin but incorporated into the base to provide a light-emitting apparatus in which color change of the sealing resin by heat can be suppressed, and light of a constant color can be emitted for an extended period of time.

The fluorescent material can be dispersed in the base, or a film containing the fluorescent material can be laid on or buried in the base. The fluorescent material to be used is selected arbitrarily in accordance with the desired color of light. Where white light is desired, for example, a VAG-based fluorescent material can be combined with a blue light-emitting device.

DETAILED DESCRIPTION OF PREFERRED EMBODIMENTS

Whole structure of the present invention

Preferred embodiments of the present invention will be illustrated with reference to FIG. 1. The Light-emitting device of the invention is composed roughly of a transparent base 10, a light-emitting device 20, an adhesive layer 30, wires 40a and 40b, lead frames 50a and 50b, and a sealing resin 60.

The transparent base 10 is not particularly limited as long as its transparency to light does not substantially change with time. For example, the base 10 can be made of inorganic materials such as $SiO_2$ sapphire, and borosilicate glass. The base 10 is not particularly limited in shape but is preferably rectangular in its plane view. The size and thickness of the base 10 are decided appropriately in conformity with the size of the semiconductor Light-emitting device 20 and of the light-emitting apparatus 1. Taking a rectangular (in plane view) base for instance, a pair of opposing sides are preferably 500 to 5,000 $\mu$m long, still preferably 1,000 to 4,000 $\mu$m long, the other pair of opposing sides are preferably 500 to 5,000 $\mu$m long, still preferably 1,000 to 4,000 $\mu$m long, and the thickness is preferably 30 to 3,000 $\mu$m, still preferably 50 to 1,000 $\mu$m.

A pair of bonding pads 11a and 11b made of an electrically conductive material are provided on one side of the base 10. On the same side of the base 10 is an area where the semiconductor light-emitting device 20 is to be fixed. The bonding pads 11a and 11b can be made of any electrically conductive material and are formed by patterning on the base 10. The bonding pads 11a and 11b may have a plurality of layers made up of different materials.

It is preferred that the bonding pads 11a and 11b and the area therebetween where the Light-emitting device 20 is to be fixed be arranged on a substantially straight line. Where the base 10 is rectangular in its plane view, the bonding pads 11a and 11b are preferably formed on a substantially straight line parallel to the long side of the base 10 or on the diagonal of the base 10. In case where the short side is long enough, the bonding pads 11a and 11b may be arranged on a straight line substantially parallel to the short side. Each bonding pad 11a or 11b is formed so as to maximize the distance between the lead frames 50a and 50b thereby to facilitate working of the lead frames and attachment thereto. This can be achieved by positioning the outer edge of each bonding pad 11a or 11b even with the outer edge of the base 10.

On the base 10 is fixed the semiconductor Light-emitting device 20. The Light-emitting device 20 has a substrate 21, GaN-based semiconductor layer, a negative electrode 26, and a positive electrode 27. The substrate 21 can be made of any transparent material, such as sapphire. Each GaN semiconductor layer is formed on the substrate by well-known metal organic vapor phase epitaxial growth (MOVPE), etc.

The negative electrode 26 and the positive electrode 27 are formed by an etching technigue, etc. in a usual manner. The negative and the positive electrodes 26 and 27 are both preferably made or light-reflecting materials so that the light from the light-emitting layer which is in the direction opposite to th dominant light-emitting direction may be reflected and turned to the dominant light-emitting direction. By this manipulation, a lack of light can be prevented, and the quantity of light traveling in the dominant direction increases. Materials useful as the negative electrode 26 and the positive electrode 27 included Al, V, Ac, and Rh. One or more layers of these materials are superposed to form each electrode. The thickness of each electrode is not particularly limited as far as is capable of bonding. From the standpoint of the time required for forming each electrode, 5000 Å to 50,000 Å is recommended. The positive electrode 27 could be made thinner by further providing an electrode for bonding on the postive electrode 27. In this case, it is rather preferred for the positive electrode to have some thickness to prevent a light leakage from the electrode side. For example, the positve electrode preferably has a thinkness of 50 Å or more, particularly 300 Å or more. Most of the light generated in the LE layer of the Light-emitting device 20 having the above-described structure is, either directly of after being reflected on the electrodes, transmitted through the taransparent base 10 and emitted outside.

The Light-emitting device 20 is adhered on its substrate to the base 10 via an adhesive layer 30 at the position between the bonding pads 11a and 11b. As a result, there exist the adhesive layer and the transparent base 10 in this order on the side of the substrate 21 of the Light-mitting divice. Light emitted from the substrate 21 passes through the adhesive layer 30 and then the transparent base 10.

The adhesive layer 30 should be made of a transparent material, such as an epoxy resin. Such an organic material as an epoxy resin is not stable against heat and undergoes gradual color change to yellow to brown with time by the heat generated in the Light-emitting 20. Thus, the colored resin will absorb light from the Light-emitting device 20, affecting the quantity of light emitted from the Light-emitting apparatus 1. For this reason, it is preferable to minmize the thickness of the adhesive layer 30 while securing adhesion of the Light-emitting device 20. A preferred thickness of the adhesive layer 30 made of, e.g., an epoxy resin is about 1 to 50 µm.

The negative electrode 26 and the positive electrode 27 are connected to the bonding pads 11a and 11b, respectively, by means of the respective wires 40a and 40b. Where the positive electrode 27 is not thick enough, another bonding pad (electrode layer) can be provided thereon as mentioned above, to which the wire 40b is connected.

The base 10 having the Light emitting device 20 adhered thereon is mounted on a pair of lead frames 50a and 50b, which are connected to an exteranl power source, in the same manner as in flip chip bonding. That is, the base 10 is fitted to the lead frames 50a and 50b in such a manner that the side of the substrate 21 of the light-emitting device 20 faces the dominant light-emitting direction. Any electrically conductive material can be used to make the lead frames 50a and 50b. For example, lead frames 50a and 50b can be formed of an iron sheet and plated with silver. The lead frames 50a and 50b have respective mounts 51a and 51b which face the dominant light-emitting direction. The bonding pads 11a and 11b of the base 10 are fixed to the mounts 51a and 51b, whereby the substrate 21 of the Light-emitting device 20 faces the dominant Light-emitting direction.

The lead frames 50a and 50b preferably have projections 52a and 52b, respectively, which extend from the respective mounts 51a and 51b in the dominant Light-emitting direction so that the light emitted from the Light-emitting device 20 and diffused out of the dominant Light-emitting direction can be reflected on the wall of the projections 52a and 52b and turned in the dominant Light-emitting direction.

The base 10 can be mounted on the lead frames 50a and 50b with solder, silver paste, and the like. Because of the sufficient distance between the bonding pads 11a and 11b, the lead frames 50a and 50b are well spaced out. This means that the lead frames 50a and 50b can be formed easily, and the base 10 can be mounted on the lead frames 50a and 50b with relative ease.

The transparent base 10, the Light-emitting device 20, the adhesive layer 30, the wires 40a and 40b, and the lead frames 50a and 50b are encapsulated in a transparent sealing resin 60. An epoxy resin is preferred. A urethane resin, etc. are also useful. Not only transparent and colorless resins but transparent and colored resin can be used as long as they are light-emitting. For example, a transparent and colored resin comprising an opoxy resin having dispersed therein an appropriate pigment can be used. Most of the light rays emitted from the Light-emitting device 20 are released outside through the substrate 21, the adhesive layer 30, the base 10, and the sealing resin 60.

First embodiment

The present invention will now be illustrated in greater detail by way of Examples with reference to FIGS. 2 through 8.

Figure 1:
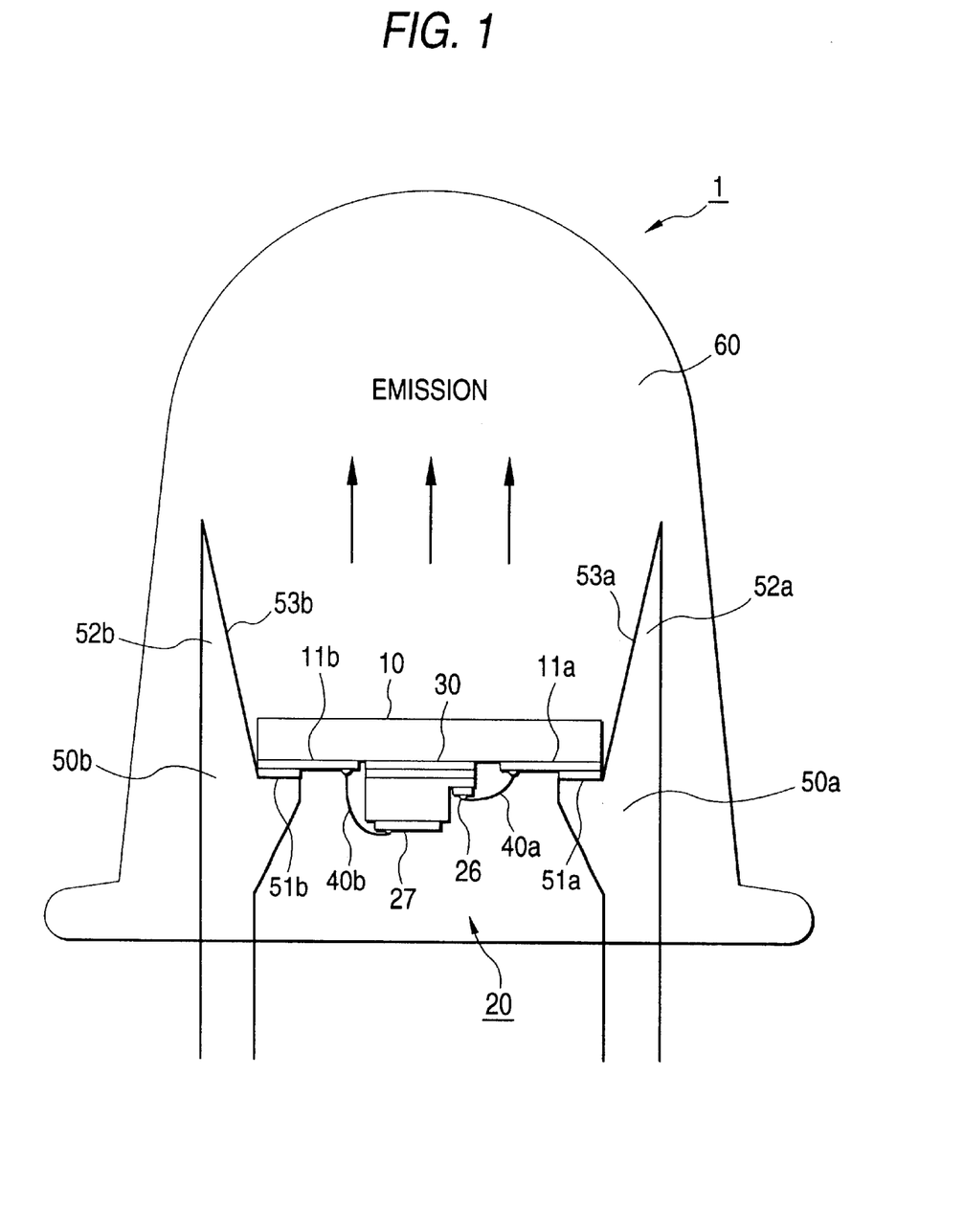
FIG. 1 illustrates a light-emitting apparatus 1 according to the invention.
Figure 2:
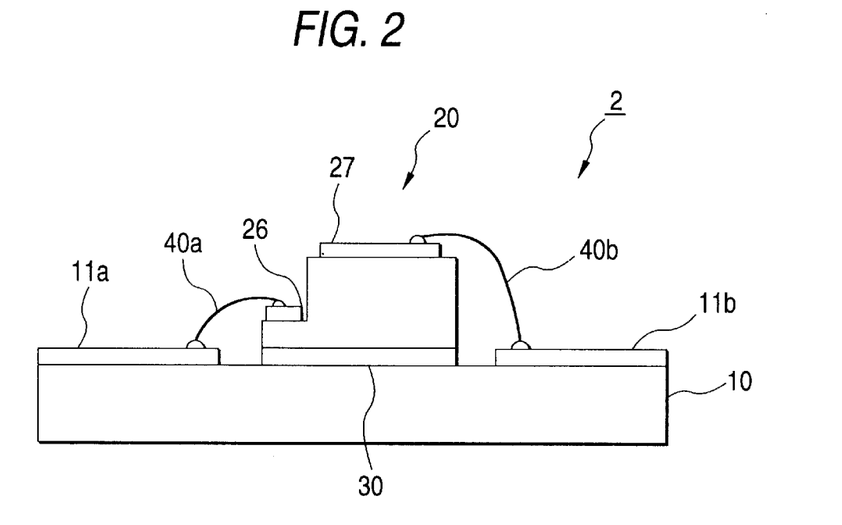
FIG. 2 is a side view of a unit 2 which is used in the light-emitting apparatus 1.

FIG. 2 is a side view of a unit 2 which can be used in the Light-emitting apparatus 1 shown in FIG. 1. The unit 2 is made up of a base 10, bonding pads 11a and 11b, and a light-emitting device 20. The base 10 is made of $Sio_2$ and has a thickness of 300 µm. Bonding pads 11a and 11b are formed on the upper surface of the base 10. Each bonding pad has an Au/Ti double layer structure with the Au layer up. The Au and Ti layers are 3,000 Å and 300 Å in thickness, respectively.

The Light-emitting device 20 (the structure of which will be described later in more detail) is fixed via an adhesive layer 30 on the surface of the base 10 where the bonding pads 11a and 11b are provided. The adhesive layer 30 is made of a transparent epoxy resin and has a thickness of about 3 µm. The negative electrode 26 has a double layer structure composed of a 175 Å thick V layer as a lower layer and a 18,000 Å thick Al layer as an upper layer. Similarly the positive electrode 27 has a double layer structure composed of a 3,000 Å thick Rh layer as a lower layer and a 5,000 Å thick Au layer as an upper layer. The negative electrode 26 and the positive electrode 2/are eclectrically connected to the bonding pads 11a and 11b, respectively, through respective wires 40a and 40b.

Figure 3:
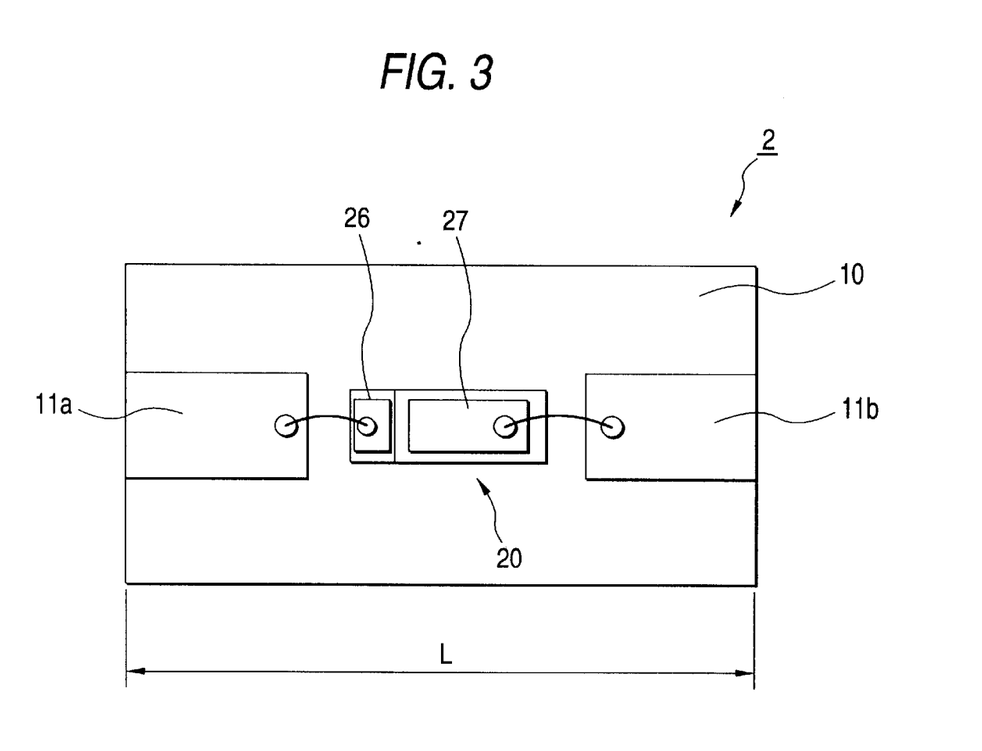
FIG. 3 is a plane view of the unit 2.

FIG. 3 is a plane view of the unit 2. The base 10 is rectangular in its plane view. The bonding pads 11a and 11b are formed on a straight line parallel to the long side L of the base 10. The edge of each bonding pad is even with the edge of the base 10. The Light-emitting device 20 is fixed onto the base 10 in the middle between the bonding pads 11a and 11b.

Figure 4:
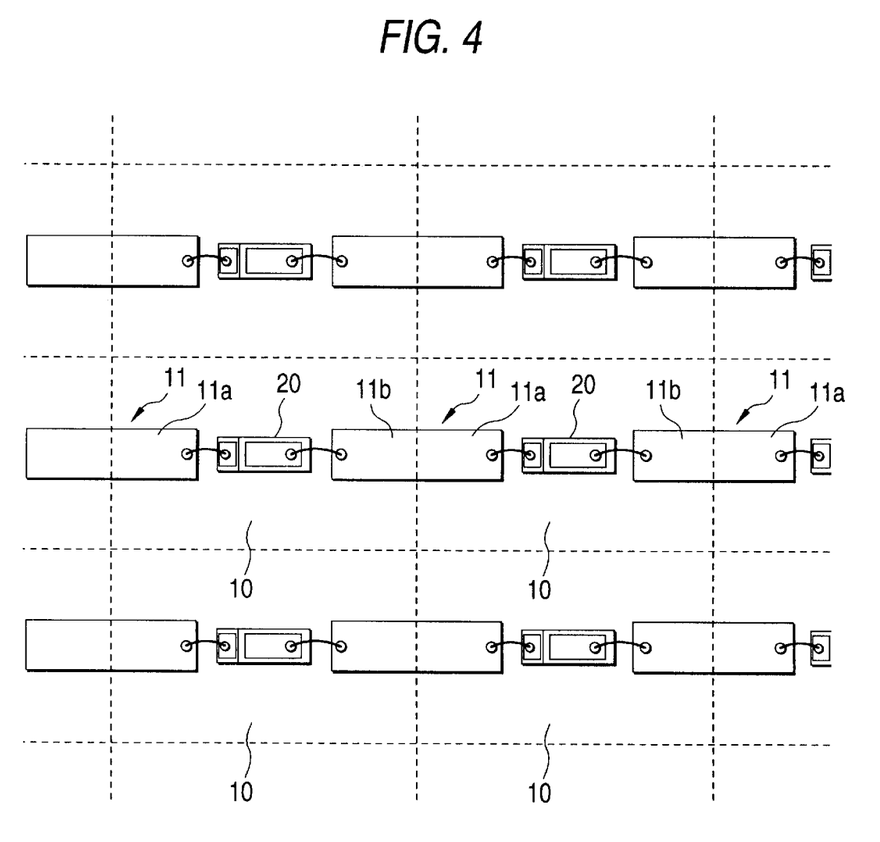
FIG. 4 is a plane view of an $SiO_2$ wafer before being cut to individual units 2.

The unit 2 is prepared as follows. As shown in FIG. 4, a bonding pattern 11 is formed on an $SiO_2$ glass wafer (base), and a light-emitting device 20 previously prepared in a conventional manner is adhered on its substrate to the glass wafer in the middle of every two adjacent bonding pads 11. The glass wafer was diced and cut along the dotted line to obtain the units 2 shown in FIG. 3.

Another embodiment

Figure 5:
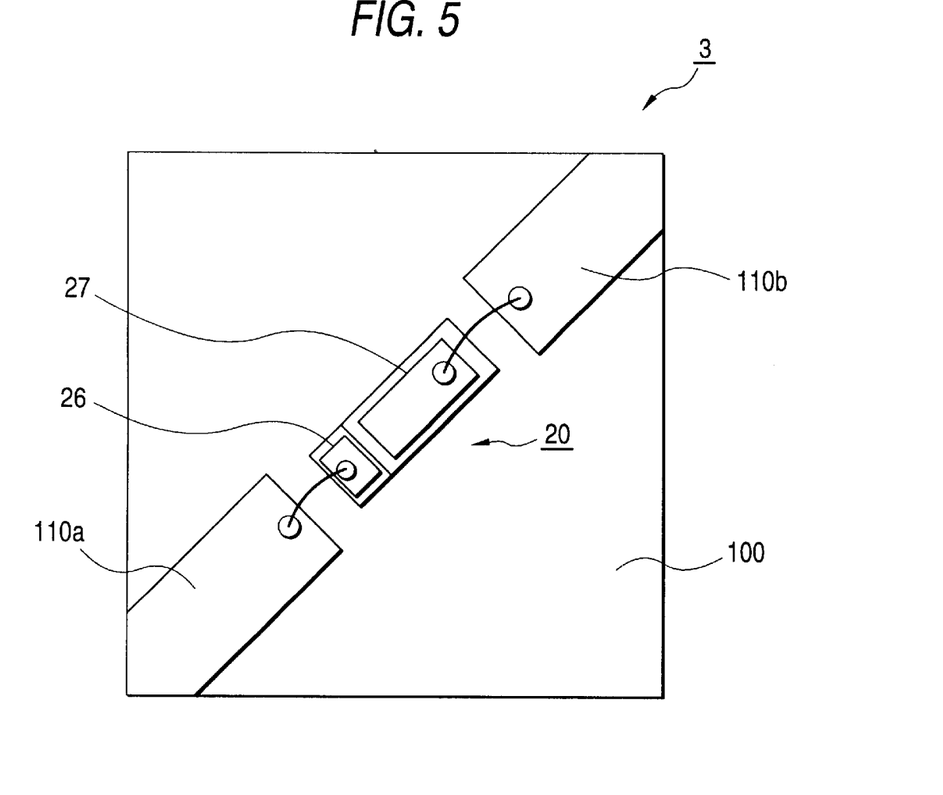
FIG. 5 is a plane view of a unit 3 used in the light-emitting apparatus 1.

FIG. 5 shows another unit 3. The same members as in FIG. 3 are given the same numerals as used in FIG. 3, and the explanations therefor are omitted. The unit 3 has a square base 100 in its plane view, and bonding pads 110a and 110b and the Light-emitting device 20 are arranged on a diagonal of the base 100.

Figure 6:
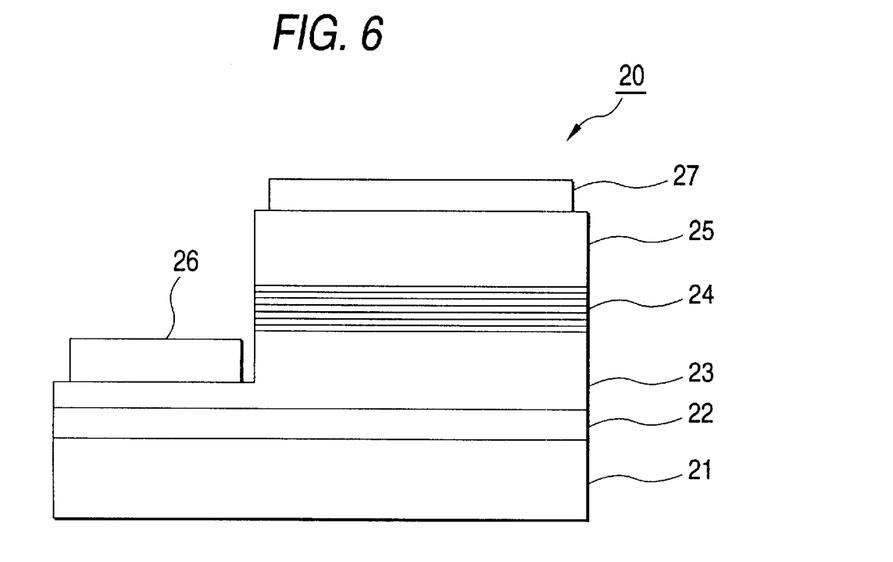
FIG. 6 is a side view of a light-emitting device 20.

FIG. 6 shows the structure of the Light-emitting device 20. The Light-emitting device 20 is a light-emitting diode composed of a substrate 21, a buffer layer 22, and n-type GaN layer 23, an active layer 24, a p-type semiconductor layer 25, a negative electrode 26, and a positive electrode 27. The specification of these members are tablulated below.

TABLE 1

| Layer | Composition:Dopant | Thick-ness |
|---|---|---|
| positive electrode (27) | Au/Rh | 5000 A/3000 A |
| p-type layer (25) | p-type GaN:Mg | 3000 A |
| active layer (24) | superlattice structure | |
| | quantum well layer: $In_{0.15}Ga_{0.85}N$ | 35 A |
| | barrier layer: GaN | 35 A |
| | number of repetition of quantum layer and barrier layer: 1 to 10 | |
| negative electrode (26) | Al/V | 18000 A/175 A |
| n-type layer (23) | n-type GaN:Si | 4000 A |
| buffer layer (22) | AlN | 500 A |
| substrate (21) | sapphire | 300 $\mu$m |

Each semiconductor layer is formed by well-known MOVPE. MOVPE is carried out by causing ammonia gas and an alkyl compound gas of the group III element, e.g., trimethylgalluium (TMG), trimethylaluminum (TMA) or trimethlindium (TMI), to pyrolyze on the substrate preheated to an appropriate temperature thereby to let a desired crystal of a compound semiconductor to grow on the substrate. After the p-type layer 25 is formed, a part of the p-type layer 25, of the active layer 24, and of the n-type layer 23 are etched to expose the n-type layer 23, on which the negative electrode 26 is provided. The negative electrode 26 and the postitive elcetrode 27 have the above-specified structure and are formed in a conventional manner. After alloying, the wafer is cut into individual chips.

The unit 2 shown in FIG. 2 is fixed to the lead frames 50a and 50b with its upside down as shown in FIG. 1. That is, the bonding pad 11a and 11b of the unit 2 are attached onto the mounts 51a and 51b of the lead frames 50a and 50b by soldering. In FIG. 1 the light from the Light-emitting device 20 is dominantly emitted upward as indicated by the arrows.

The lead frames 50a and 50b are formed by iron sheet working techniques, such as blanking, followed by silver plating. The lead frames 50a and 50b has mounts 51a and 51b to which the bonding pads 11a and 11b are fixed. The lead frames 50a and 50b have projections 52a and 52b, respectively. The inner walls 53a and 53b of the projections 52a and 52b prevent the light from the Light-emitting device 20 from diffusing laterally.

The unit 2 attached to the lead frames 50a and 50b is encapsulated in a sealing resin 60 by molding in a usual manner. A transparent epoxy resin is used as a sealing resin.

Figure 7:
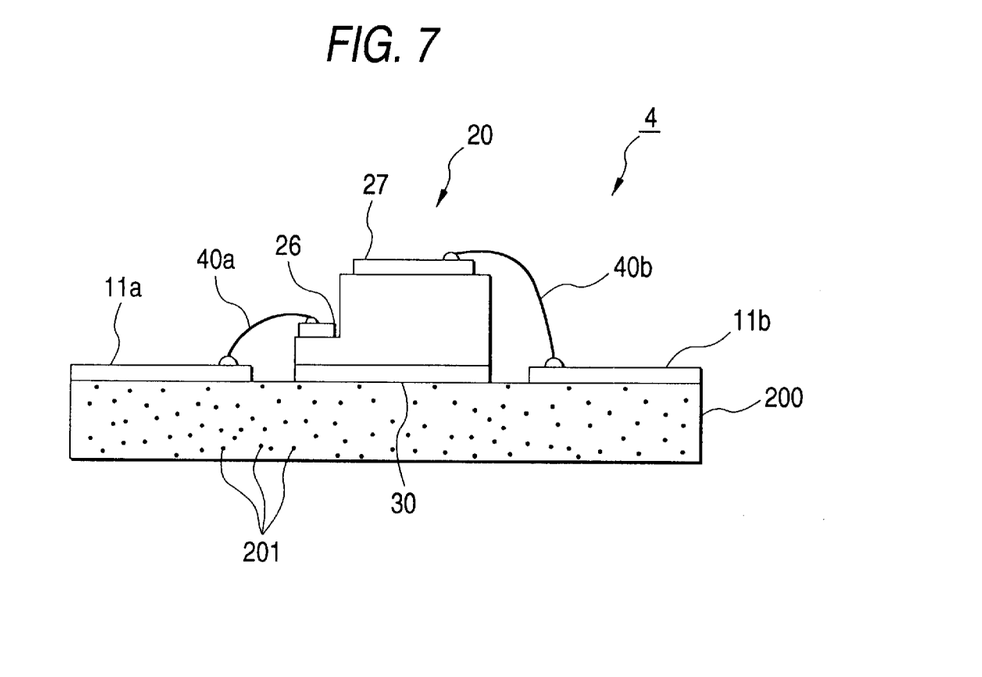
FIG. 7 is a side view of a unit 4 having a base having a fluorescent material dispersed therein.

FIG. 7 illustrates a unit 4 which can be used in another example of the light-emitting apparatus according to the invention. The same members as in FIG. 2 are given the same numerals as used in FIG. 2, and the explanation therefor are omitted. A substrate 200 is made of $SiO_2$ having dispersed therein a fluorescent material 201. A YAG fluorescent material is used as the fluoescent material 201. The unit 4 is built up and assembled into a light-emitting apparatus in the same manner as for the unit 2. In this Light-emitting apparatus; part of the light from the Light-emitting device 20 is absorbed by the fluorescent material 201 while passing through the base 200 to generate fluorescence. The fluorescence and the light that is not influenced by the fluorescent material are mixed up so that the Light-emitting apparatus emits white light as a whole.

Figure 8:
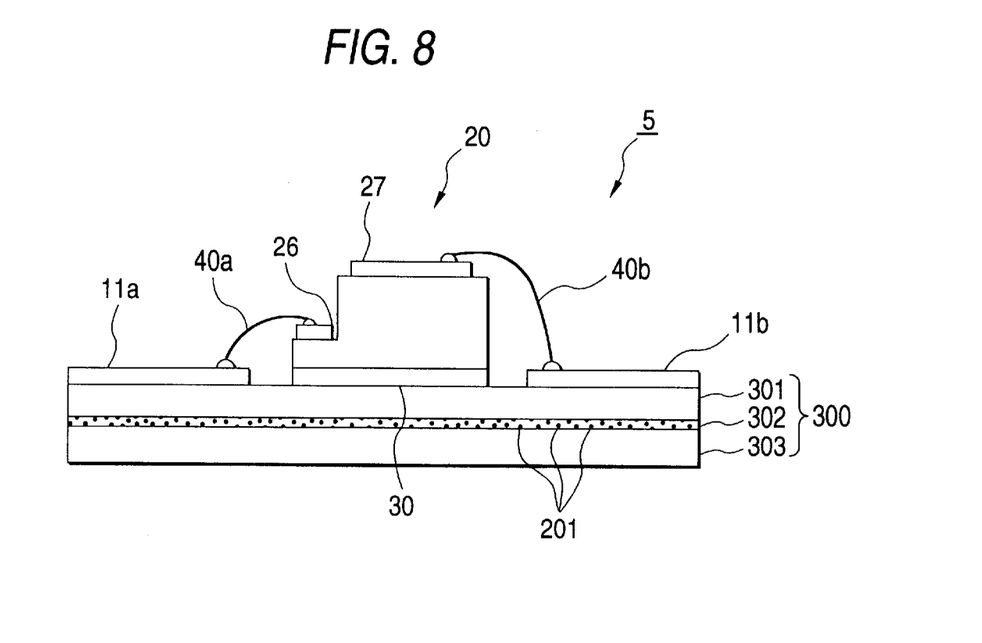
FIG 8. is a side view of a unit 5 having a base having a fluorescent material-dispersed film layer.

FIG. 8 illustrates a unit 5 which can be used similarly to the unit 4. The difference from the unit 4 lies in that a base 300 has a 3-layer structure composed of a pair of $Sio_2$ layers 301 and 303 and a fluorescent material-dispersed film layer 302 sandwiched therebetween. Similarly to the unit 4, a YAG fluorescent material is used here. The unit 5 is fixed to the lead frames and encapsulated in an epoxy sealing resin in the same manner as for the unit 2. In the resulting Light-emitting apparatus, part of the light from the Light-emitting device 20 is absorbed by the fluourescent material 201 while passing through the fuorescent material-dispersed film layer 302 to generate fluorescence. The fluorescence and the light that is not influenced by the fluorescent material are mixed up so that the Light-emitting apparatus emits white light as a whole.

Test Example.

The performance of the Light-emitting apparatus 1 according to the invention was tested as follows. An electric current of 30 mA was continuously passed through the Light-emitting apparatus in an atmosphere kept at 100° C., and the intensity of light emitted from the apparatus was measured with time to obtain light intensity retention (%) (the initial light intensity was taken as 100%). The results obtained are shown is Table 2 below, in which Comparative Example is a conventional Light-emitting apparatus having the same Light-emitting device as tested.

TABLE 2

| | Light Intensity Retention (%) | |
|---|---|---|
| | Initial (0 hr) | After 1000 hrs |
| Invention | 100 | 90 |
| Comparative Example | 100 | 75 |

It can be seen from the results that reduction in light intensity with time is significantly suppressed in the Light-emitting apparatus of the present invention as compared with the comparative example.

While the invention has been described in detail and with reference to specific examples thereof, it will be apparent to one skilled in the art that various changes and modifications can be made therein without departing from the spirit and scope thereof.

What is claimed is:

1. A light-emitting apparatus comprising:
   a transparent base made of an inorganic material;
   a first and a second bonding pad formed on the base;
   a GaN semiconductor light-emitting device having a transparent substrate, a first and a second electrode on one side thereof;
   a first and a second wire which connect said first bonding pad to said first electrode and said second bonding pad to said second electrode, respectively;

a first and a second lead frame to which said trasparent base is fixed so that the substrate of said semiconductor light-emitting device faces the dominant light emitting direction of said light-emitting apparatus, and said first and second bonding pads being electrically connected to said first and second lead frames, respectively; and a transparent adhesive layer which fixes the transparent substrate of said semiconductor light-emitting device, said first and second wires, said first and second lead frames, and said adhesive layer.

2. A light-emitting apparatus according to claim 1, wherein said first bonding pad and said second bonding pad are provided on said first surface of said base, said first lead frame has a first mount facing said dominant light emitting direction, said second lead frame has a second mount facing said dominant light emitting direction, said first bonding pad is fixed onto said first mount with an electrical connection, and said second bonding pad is fixed onto said second mount with an electrical connection.

3. A light-emitting apparatus according to claim 1, wherein each of said first and second electrodes is a light-reflecting and eletrically conducting metal layer.

4. A light-emitting apparatus according to claim 1, wherein said base is made of material selected from the group consisting of a $SiO_2$ sapphire and borosilicate glass.

5. A light-emitting apparatus according to claim 2, wherein said base is made of a material selected from the group consisting of a $SiO_2$ sapphire and borosilicate glass.

6. A light-emitting apparatus according to claim 3, wherein said base is made of a material selected from the group consisting of a $SiO_2$, sapphire and borosilicate glass.

7. A light-emitting apparatus according to claim 2, wherein said GaN semiconductor light-emitting device is fixed on said first surface of said base between said first and second bonding pads.

8. A light-emitting apparatus according to claim 7, wherein said base is rectangular in its plane view.

9. A light-emitting apparatus according to claim 7, wherein said first and second bonding pads are formed substantially in parallel with the long side of said first surface.

10. light-emitting apparatus according to any one of claims 1 to 9, wherein said base has dispersed therein a fluorescent material.

11. A light-emitting apparatus according to any one of claims 1 to 9, wherein said base is defined by a plurality of layers, and at least one of said layers contains a fluorescent material.

12. A light-emitting apparatus according to claim 10, wherein said base is defined by a plurality of layers, and at least one of said layers contains a fluorescent material.

13. A light-emitting apparatus according to claim 1, wherein the first and second bonding pads are formed on a diagonal line of the first surface of the base.

* * * * *